United States Patent
Lipka

(10) Patent No.: US 7,227,910 B2
(45) Date of Patent: Jun. 5, 2007

(54) COMMUNICATION DEVICE WITH CONFIGURABLE SIGMA-DELTA MODULATOR

(75) Inventor: Dietmar Lipka, Berg (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 774 days.

(21) Appl. No.: 10/311,911

(22) PCT Filed: Jun. 21, 2001

(86) PCT No.: PCT/EP01/06993

§ 371 (c)(1), (2), (4) Date: Apr. 21, 2003

(87) PCT Pub. No.: WO02/01726

PCT Pub. Date: Jan. 3, 2002

(65) Prior Publication Data

US 2004/0036638 A1  Feb. 26, 2004

(30) Foreign Application Priority Data

Jun. 28, 2000  (EP)  .................... 00113665

(51) Int. Cl.
*H03C 3/00* (2006.01)
*H03K 7/06* (2006.01)
*H04L 27/12* (2006.01)

(52) U.S. Cl. .............. 375/302; 375/298; 375/225; 375/240.3; 375/243; 375/316

(58) Field of Classification Search ........ 375/302, 375/298, 225, 240.03, 243, 316
See application file for complete search history.

(56) References Cited

U.S. PATENT DOCUMENTS 6,075,820 A * 6/2000 Comino et al. ............ 375/245
6,744,825 B1 * 6/2004 Rimstad et al. ............ 375/298

* cited by examiner

*Primary Examiner*—Jean B. Corrielus
*Assistant Examiner*—Nader Bolourchi

(57) ABSTRACT

In up-to date communication devices an intermediate frequency signal is generated at first in a digital way and than is converted to an analogue signal by a digital-to-analogue converter (10). In order to offer a greater flexibility in choosing a particular digital-to-analogue converter (10) the invention proposes to use sigma-delta modulators (8), the output bit width (n) of which is arranged to be configurable. The advantage of providing sigma-delta modulators with a configurable output bit width is that by this the output bit width of the interpolation filters can be easily adapted to the input bit width of a chosen digital-to-analogue converter without the need to change the internal design of a baseband processing circuit.

5 Claims, 5 Drawing Sheets

COMMUNICATION DEVICE WITH CONFIGURABLE SIGMA-DELTA MODULATOR

Figure 1:
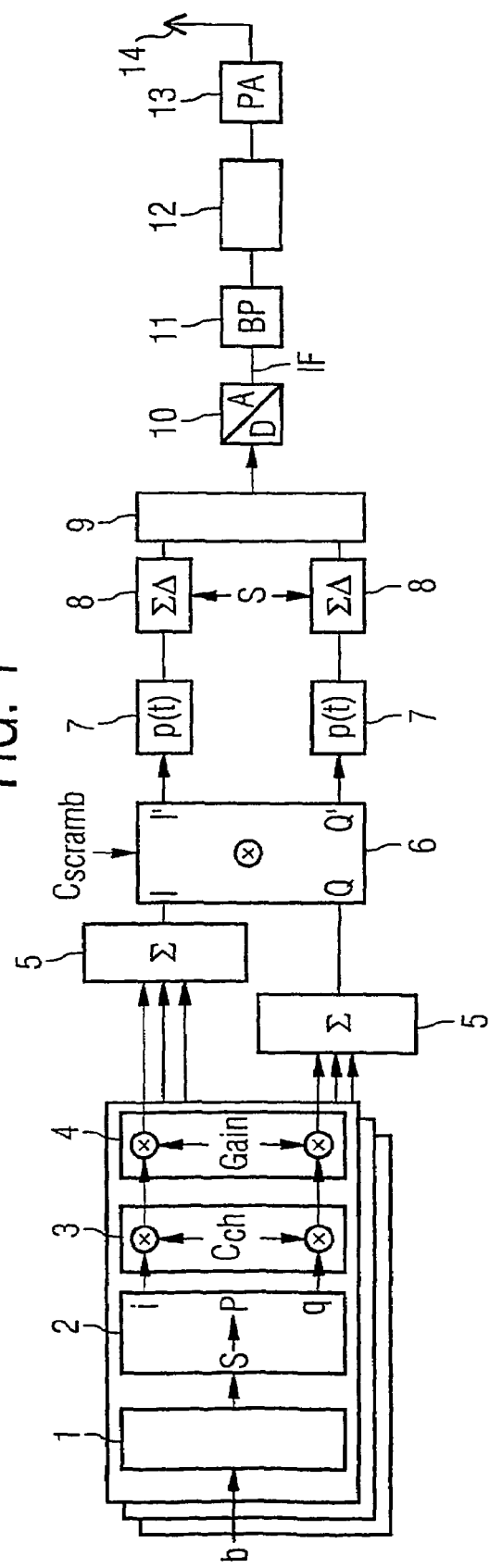

This application is a 371 of PCT/EP01/06993, filed Jun. 21, 2006.

FIELD OF THE INVENTION

The present invention relates to a method for digital generation of an analogue quadrature modulated radio signal as disclosed in the preamble of claim 1, and to a communication devices or a circuit for a communication device making use of this method.

DESCRIPTION OF THE PRIOR ART

A method for quadrature modulation and digital-to-analogue conversion of a sampled and digitally represented input signal in form of a complex baseband signal, represented by an in-phase component and a quadrature-phase component, is known for instance from WO 98/20657. In the prior art each component signal is separately sampled at a sampling rate sufficiently high to achieve a desired quantization noise shaping. By means of sigma delta modulation the noise signal is shaped spectrally to have its energy essentially outside the frequency band of the input signal. The signal components I and Q are quadrature modulated to a carrier frequency equal to exactly one quarter of the sampling rate for the quadrature modulated signal, so that repeated spectra of the modulated signal can thereby be found around all odd multipliers of the carrier frequency. Usually digital quadrature modulation of I and Q is carried out at a quarter of the sampling rate, as at this sampling rate the multiplication of I and Q with a sine and a cosine signal can be easily achieved with multiplying with a repeated sequence of [0, 1, 0, −1 and [1, 0, −1, 0] respectively. In practice this is carried out by inverting every second sample of each signal and instead of adding the two signals a multiplexer switches alternatively to that signal component, that is not subject to a multiplication with the factor zero. The digital samples at the output of the multiplexer are converted by means of a digital-to-analogue converter to a corresponding analogue intermediate frequency (IF) signal. This IF signal is then up-converted in a conventional way to a desired transmitter frequency.

In the cited prior art a sigma-delta modulation in connection with oversampling is used so that the quantization noise of the digital-to-analogue conversion is shaped spectrally so that most of this noise ends up outside the frequency band of interest. As for reasons of simplicity the output signal of the sigma-delta modulators is only one bit a very high oversampling factor (a fact an oversampling factor F=20 has been mentioned) has to be chosen. Also a repetition of sample values is foreseen so that the sample rate of the in-phase and quadrature signal each separately are represented by only half of the sampling rate of the quadrature modulation.

Among other reasons like power consumption and dimensions of a communication device a lot of the aforementioned functions are carried out by a software controlled digital signal processor or in a more hardware orientated solution are integrated in an integrated circuit. Also hardware programmable logic circuits like Application Specific Integrated Circuits (ASICs) are common. If a one bit digital-to-analogue converter is used this digital-to-analogue converter could be integrated with all the other functions like filters, sigma-delta modulators in a single circuit. As in practice design restrictions, e.g. clock rates, have to be observed over-sampling could not be increased without any limits. By using a digital-to-analogue converter with a higher bit width at the input the over-sampling rate could be reduced. For performance and economic reasons this will often mean that a separate digital-to-analogue converter from a third party supplier has to be used instead of an integrated one.

The electrical properties of available third party supplier are subjected to changes. From time to time it may even happen that a certain circuit is discontinued. As a result of this the baseband processing device will have to be partly redesigned.

SUMMARY OF THE INVENTION

It is an object of the invention to introduce a concept that offers a greater flexibility in adapting baseband processing to specific needs and to save investments in circuit design and development costs.

This object is achieved by using a sigma-delta modulator, the output bit width of which is arranged to be configurable.

The advantage of providing sigma-delta modulators with a configurable output bit width is that by this the output bit width of the interpolation filters can be easily adapted to the input bit width of a chosen digital-to-analogue converter without the need to change the internal design of a baseband processing circuit. By this the same baseband processing circuit can be used without modifications with different digital-to-analogue converters. Thus the most appropriate digital-to-analogue converter can be chosen from an up-to-date supply. For instance if a certain analogue-to-digital converter with certain properties like signal-to-noise ratio is at the moment available only as a 14-bit-DAC it is possible to switch later on e.g. to a 12-bit DAC which provides the same properties but at a lower price.

Preferably the output bit width is made adjustable by means of control information like a control data word or input terminals which have to be set to a certain voltage level, e.g. by jumpers or solder straps so that the sigma-delta modulators are (re-)configurable at minimum efforts and costs.

The usage of digital-to-analogue converters with a higher number of input bits also makes it possible to use a lower over-sampling factor. Among others this has a positive effect on power consumption. On the other hand one might have to face a drawback in accuracy by an increase phase error between the samples of the in-phase and quadrature samples. Corresponding on the individual application this phase error might not be longer tolerable.

Appropriate phase correction methods according to the principles of the invention provide the advantage that they can be easily integrated in the interpolation filter arrangement by just changing the filter characteristics. As the interpolation filters have to be present anyway no additional hardware circuits have to be spent for the purpose of a mutual phase shift between the in-phase and the quadrature signal.

A preferred embodiment to make the output signal of a sigma-delta modulator configurable, according to the principles of the invention, has the advantage that only simple logic gates have to be provided as switches in some of the output lines of the sigma-delta modulators. Thus, this is a very simple solution with very low circuital erogation.

BRIEF DESCRIPTION OF THE INVENTION

In the following the invention will be further described according to the figures and by means of examples FIG. 1: Block diagram of a Wideband CDMA radio transmitter FIG. 2 First embodiment of a filter arrangement, sigma-delta modulator, IQ-modulator and digital-to analogue converter FIG. 3 Second embodiment of a filter arrangement, sigma-delta modulator, IQ-modulator and digital-to analogue converter FIG. 4 Circuit arrangement of an configurable sigma-delta modulator FIG. 5 Spectra of a digital IF signal and quantization noise without sigma-delta modulation FIG. 6 Spectra of a digital IF signal and quantization noise with sigma-delta modulation As an embodiment of the invention a transmitter for wideband code division multiplex access (W-CDMA) communication systems has been chosen. W-CDMA, as it is designed and standardised at the moment by 3GPP (third generation partnership project), provides direct sequence spreading to allow different users to share a common carrier frequency band by applying uniquely assigned code sequences, so-called spreading codes to their data. It is a general property of direct sequence spreading that the data rate of the spreading codes is always higher than the data rate of the user data. To distinguish the bits of the user data from the bits of the spreading code a bit of the spreading code is called chip and the data rate of the spreading code therefore chip rate. The sum of all signals in a CDMA frequency band appears statistically as a random signal, comparable to a noise signal. As the spreading codes are usually chosen in a way that they are orthogonal a receiver with the knowledge of a particular used spreading code is capable to extract a signal transmitted by a specific user from that "noise signal".

To improve the performance of 3GPP W-CDMA systems the spreading codes are composed of two separate codes in a way that preserves the orthogonal properties of these codes. A first code is used to distinguish different users in a cell from each other. As by this first code a separate physical channel can be assigned to each user (in the same frequency band) this first code is called channel code $c_{ch}$. As the codes are constituted in an appropriate way it is very easy to adapt the data rate of each channel by assigning a channel code with an appropriate length. A second code, the scrambling code $c_{scramb}$ is used to distinguish neighbored or overlaid cells.

FIG. 1 shows a block diagram of a radio transmitter according to the invention designed for a base station of a W-CDMA system in which up to the generation of a first intermediate frequency (IF) signal all signals are processed exclusively as digital signals. The digitally generated intermediate frequency signal is then converted to an analogue signal and up-converted to a desired transmitter radio frequency signal. Although there are some design differences in the W-DCMA system between up-link and down-link in order to be concise in the following only the transmitter for a base station will described as the design differences do not affect the subject of the invention.

Binary user data b, which is a multiplexed binary data stream of useful bits (e.g. digital encoded speech signals) and control information is encoded and interleaved in an encoder and interleaver 1. As in down-link the W-CDMA systems applies a QPSK-modulation scheme, every two succeeding bits of the binary data stream at the output of the interleaver 1 are mapped by a base band modulator 2 to a complex base band format, consisting of an in-phase component i and a quadrature component q. Each component is still a binary signal. To distinguish the data of different users a channel spreader 3 multiplies each base band signal component i, q with a binary channel code sequence $c_{ch}$ that has been assigned individually to each user. Thus the output signal of the channel spreader 3 is still a binary signal. To adjust the output power of each channel the channel coded in-phase and quadrature binary signals are multiplied by gain control means 4 with a gain factor GAIN giving samples with a bit width greater than one. In this embodiment the bit width of those samples has been chosen to fourteen bits.

For reasons of clarity up to here only the processing of a single channel has been described. In a base station of course a multitude N of channels is processed in parallel. To form a single wideband output signal the in-phase and the quadrature components i,q of all these channels 1 . . . N are summed up separately by two adders 5 giving sum signals I and Q. By means of a complex multiplier 6 these signals are multiplied with the complex scramble code $c_{scramb}$. Each scrambled component signal I', Q' is then processed separately again. As in 3GPP the chip rate of the scrambling code sequence $c_{scramb}$ has been fixed to 3.84 mega chips per second (Mcps) the sample rate of the two scrambled component signals I', Q' is increased by scrambling to this value.

By means of a digital filter arrangement 7 the component signals I', Q' are shaped and up-sampled to 30.72 Msps. Then the up-sampled component signals are fed each via sigma-delta modulators 8 to an IQ-modulator 9, which generates an output signal of 61.74 Msps. A digital-to-analogue converter (DAC) 10 converts the output signal of the IQ-modulator 9 to an analogue signal.

By means of the interpolation filter arrangement 7 the bit width of the samples is increased in this embodiment of the invention from fourteen bits to sixteen bits. According to the invention the sigma-delta modulators 8 have been provided each with a preset input 80 where a preset value S can be set in order to determine the bit width n of the samples at the sigma-delta modulators 8 outputs. Thus the bit width n of the samples at the output of the sigma-delta modulators 8 can be adjusted that it corresponds to the resolution (=bit width of input samples) of the digital-to-analogue converter 10. As the IQ-modulator 9 only multiplexes the in-phase and quadrature samples or the inverted samples respectively it does not change the bit width of the samples.

Due to the over-sampling of the filter arrangement 7 there would be two analogue signals, one at 15.36 MHz and one at 46.08 MHz. As at a higher frequency a DAC has a lower performance, e.g. resulting in a lower signal to noise ratio, the 46.08 MHz signal is suppressed by the filter arrangement 7 as well as by a conventional band pass filter 11 at the output of the DAC 10. Thus only the 15.36 MHz signal is used for up-converting this analogue signal in an up-converter arrangement 12. The up-converted RF signal is then amplified by a power amplifier 13 and fed to an antenna 14.

Figure 2:
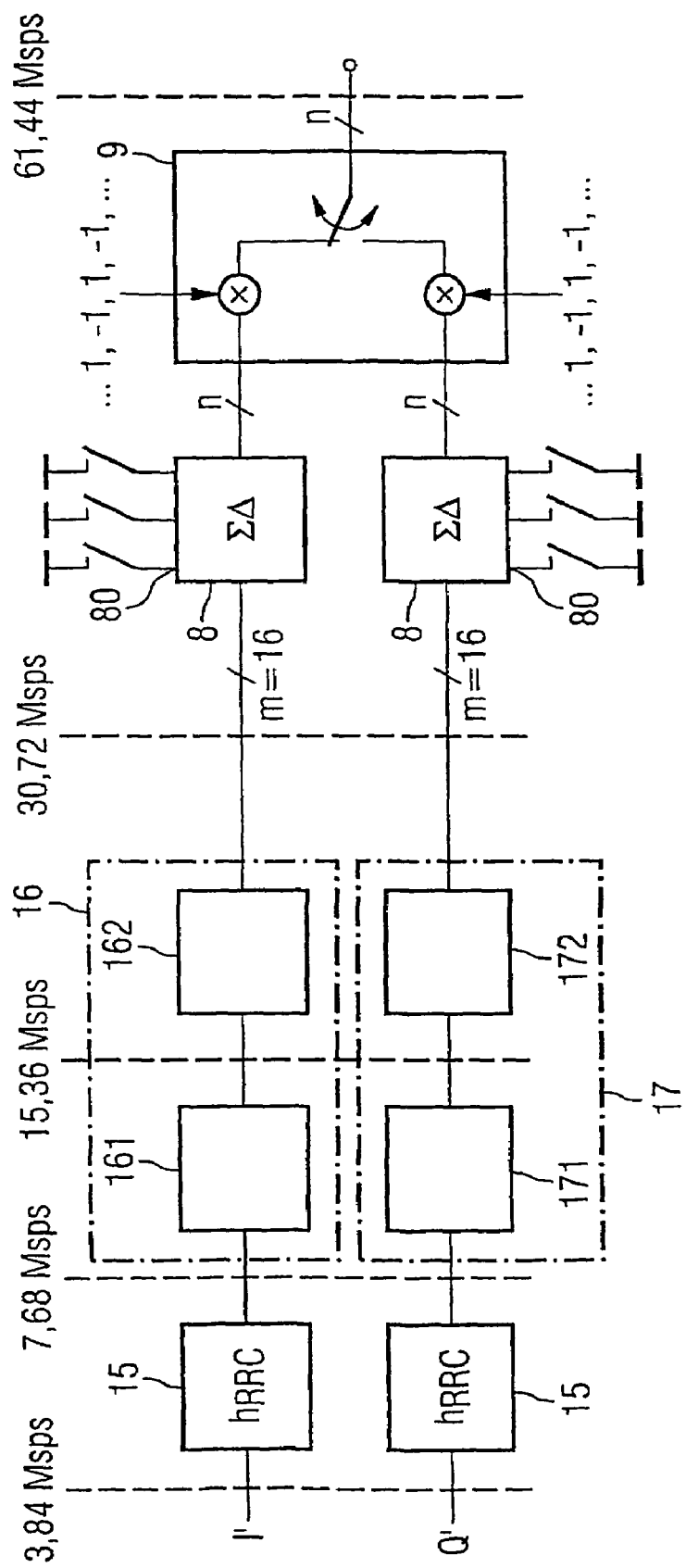

By reference to FIG. 2 the interaction of the filter arrangement 7, the sigma-delta modulators 8 and the IQ-modulator 9 is elucidated in more detail. The filter arrangement 7 is composed of two parallel filter branches. One branch for the in-phase samples I' and one branch for the quadrature samples Q'. The primary purpose of the filter arrangement 7 is to prevent out-of-band emissions by means of pulse shaping. In order to reduce the total number of filter taps an arrangement of up-sampling stages and pulse shaping filter has been chosen where identical pulse shaping filters 15 are placed at the input of each filter arrangement 7. Interpolation filters 16, 17 are connected to the output of the pulse shaping filters 15 for up-sampling and interpolating the values of the hereby inserted samples. As the best way of interpolating it has been found to use a cascade of filter stages 161, 162, 171, 172, each filter stage 161, 162, 171, 172, inserting and interpolating only one new sample between two existing samples.

At first by means of the pulse-shaping filters 15 the component signals I', Q' are up-sampled for a first time. The pulse-shaping filters 15 are implemented as finite impulse response filters with root raised cosine (RRC) characteristic with a data word width of sixteen bits at their outputs. Due to up-sampling the sample rate of each of the two component signals I', Q' at the output of the pulse-shaping filter 15 is doubled to 7.68 Msps.

The spectrally shaped signals are then up-sampled by the cascade of two digital interpolation filter stages 161, 162 for the in-band signal component I' and by the cascade of filter stages 171, 172 for the quadrature component Q' of the complex base band signal. In each filter stage 161, 162, 171, 172 one interpolated sample is inserted between each two samples of the input signal thus doubling the output data rate at the output of an interpolating filter in respect to the data rate at the input of each filter stage. The interpolation filter stages 161, 162, 171, 172 are implemented as half band filters and are also used to suppress the image of the RRC filter which appears when increasing the sampling rate of a factor by two. After having been up-sampled two times, each time by a factor of two, the sample rate of the output signal of the last filter stages 162, 172 is 30.72 Msps. In this embodiment the interpolation filter stages do not change the bit width of their samples so that at the output of the filter stages 161, 162, 171, 172 the bit width is still sixteen bits.

The output data of each last filter stage 162, 172 is fed to two identical sigma-delta modulators 8 in order to adapt the bit width m of the filtered samples of sixteen bits to the bit width n of the digital to analogue converter (DAC) 10. In the embodiment of the invention switches 80 are used to set the bit width n of the sigma-delta modulators 8 output samples thus that it corresponds to the input resolution of a particular used DAC 10.

Figure 4:
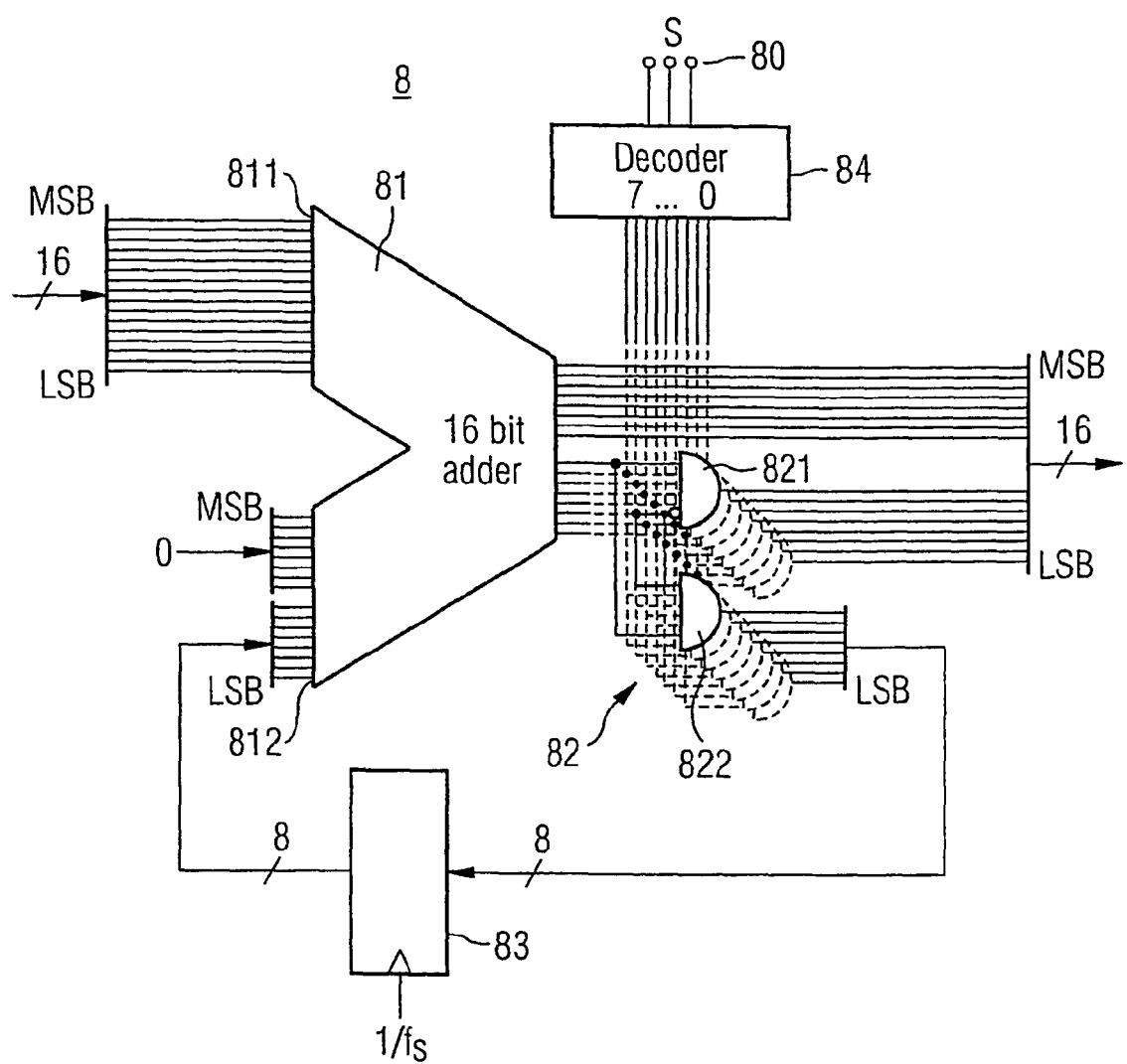

FIG. 4 shows a preferred embodiment of a configurable sigma-delta modulator 8 consisting of a 16-bit adder 81, a feedback switch 82, a quantization error filter 83, and a control decoder 84 for controlling the feedback switch 82. The 16-bit adder 81 provides two 16-bit input ports. One input port 811 represents the input of the sigma-delta modulator 8 the other input port 812 is used as feedback input for the quantization error. The feedback switch 82 is inserted between the eight least significant bits of the adder's 81 output port and the output lines of the sigma-delta modulator 8. It is used to switch a variable number of least significant bit carrying output lines of the output port of the adder 81 through to the output of the sigma-delta modulator or to the input lines of the quantization error filter 83.

In the preferred embodiment a eight-bit latch is used as quantization error filter 83. The latch 83 is clocked with the sample clock of the input samples and therefore delays its input samples for exact one sample period. The delayed samples are fed to the second input port of the adder 81. As only a maximum number of eight bits is fed back to the least significant bit carrying input lines of the feed back input port 812 of the adder 81, the eight most significant bit carrying input lines are set permanently to the binary value zero.

The number of lines fed back via the latch 83 could be varied between one and eight, thus setting the output resolution of the sigma-delta-modulators 8 to a value between fifteen and eight bit. In order to control the eight according switching states of the feedback switch 82 with a minimum of control terminals the control decoder 84 is used to convert a three-bit binary value to corresponding switching states. For instance if all input control terminals of the control decoder 84 are set to a value of zero the feedback switch 82 is controlled thus that only the least significant output line of the adder 81 is fed to the latch 83, if the input control terminals are set to a value of one the least two significant output lines are fed back and so on.

If a configuration is expected to be changed seldom solder straps can be used to set the input control terminals 80 of the control decoder 84 to appropriate voltage levels. If a configuration is subjected to perpetual changes so-called jumpers or micro switches would be appropriate for more convenience. Another possibility is to realize the decoder as a software controlled device where the configuration information is transmitted to that control decoder from e.g. a configuration memory via an internal control bus.

The feedback switch 82 may be build by an array of change-over switches. A very simple embodiment of the feedback switch 82 can be achieved by using two AND gates 821, 822 for each line to be switched. The respective output line of the adder 81 to be switched is connected to each first inputs of the both AND gates 821, 822. The output of one AND gate 821 represents the respective output of the sigma-delta modulator 8, the output of the other AND-gate 822 is connected to an respective input of the latch 83. An respective output of the control decoder 84 is fed to the other input of the one AND gate 821 with its non-inverted value and to the other AND gate 822 with its inverted value. Thus, depending of the value of the control decoder's output if the respective output of the adder 81 shows a logical "1" this value is passed to the output of the sigma-delta modulator or to the latch 83 respectively. In all other cases the outputs of the AND gates 821, 822 show a logical "0".

By adding the quantization error to the input signal of the sigma-delta modulator 8 the quantization error is averaged. Thus by means of the sigma delta modulators 8 the resolution loss at the transition from high-resolution digital samples to digital samples with reduced resolution is compensated to a great amount or even improved. This means that for a relatively high sample rate a less expensive DAC can be chosen and despite the resolution loss the whole arrangement still benefits from the higher resolution used in the filter stages 161, 162, 171, 172.

The output signal of each sigma-delta modulator 8 is input to the IQ-modulator 9. For the following explanation let us assume the samples I0, I1, I2, I3, I4, I5, I6, . . . and Q0, Q1, Q2, Q3, Q4, Q5, Q6, . . . represent a stream of in-phase and quadrature samples. A perfect IQ-modulator would assemble a data stream like I0, Q1,−I2, −Q3, I4, Q5, −I6, . . . This yields a correct output sequence, the even indexed I-samples are interleaved with the odd indexed Q-samples (or vice versa, depending on the sample the data stream is starting with). Thus the sample rate of the in-phase and quadrature signal corresponds exactly to the sample rate of the output signal of the IQ-modulator. In the present embodiment for the output data stream of the IQ-modulator 9 only odd or only even samples of the ideal data streams are used giving a data stream like I0, Q0, −I2, −Q2, I4, Q4, I6, . . . But by this a phase shift error between the in-phase and quadrature component is introduced. This phase shift error can be neglected if the sample rate respective the interpolation factor is very high.

In the case of the described embodiment the over-sampling factor is moderate (about six) so that the phase error is in the range of 3%. In 3GPP W-CDMA this phase error will violate the system specifications. To compensate this phase shift error in the preferred embodiment of the invention it has been considered to be the most efficient implementation to apply a mutual time shift between the in-phase and quadrature component at the last filter stages 162, 172. In principal a mutual time shift can be achieved by interpolating only one of the component signals I' or Q' with a factor of two. The resulting interpolated values will correspond to the required time shifted values. But this requires at supplementary interpolation filter that runs at a doubled clock rate. The preferred embodiment gets along without a rise in the clock frequency. For this purpose one of the two last filter stages 152, 162 is designed as a filter with even order (=even indexed coefficients) and the other last filter stage is designed as a filter with odd order (=odd indexed coefficients). Such filters can be designed and optimized independent from each other. Especially, if like in this embodiment, the last interpolation is by a factor of two, half-band filters are most efficient and perform best. Due to the high sampling rate filters with low orders are sufficient, e.g. a six-order-filter for the in-phase samples and a seven-order-filter for the quadrature samples.

Figure 6:
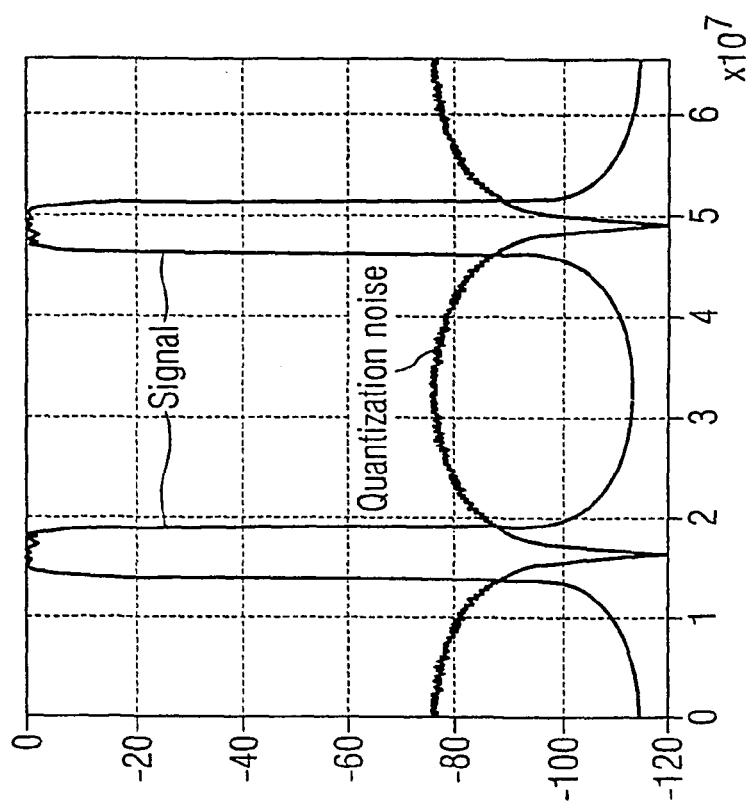
Figure 5:
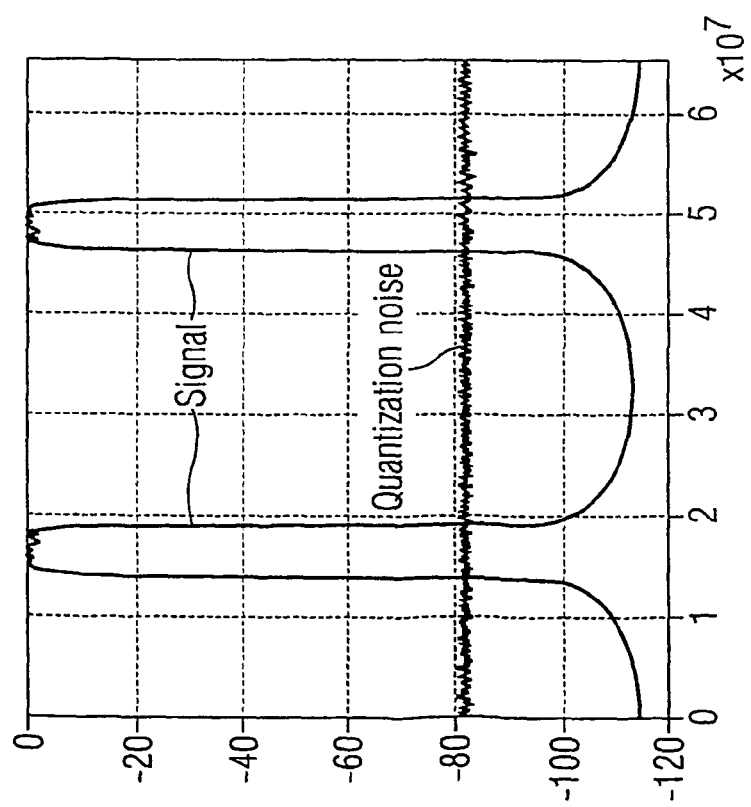

FIG. 5 shows the spectra of the digital IF signal and quantization noise without sigma delta modulation and FIG. 6 shows the same spectra if the described sigma delta modulation is applied to a W-CDMA signal. The bandwidth of the signal is 5 MHz with root raised cosine shape. The sample rate is 65.536 Msps yielding a digital IF of 16.384 MHz. The signal is quantized to twelve effective bits meaning that four bits of the sixteen bit output of the sigma-delta modulator is fed back. The sigma delta modulators in the in-phase and quadrature signal lines are of first order. Calculating the signal to noise ratio in the signal band shows an improvement of the dynamic range of 13 dB. In contrast hereto the theoretical increase of the signal-to noise ratio while using a 16-bit DAC is only 12 dB. That means that by means of the sigma-delta modulation the signal-to-noise ratio is even better. This effect can be further enhanced with a higher order sigma delta modulator.

The signal to noise ratio in the adjacent channel, 5 MHz of the signal's centre frequency and in the next adjacent channel 10 MHz of the signals centre frequency is 4 dB, about the same in both cases. However, if a higher interpolation in connection with a DAC with a higher sampling rate will be used, the dynamic range could be improved further. That gives the opportunity to gain a higher intermediate frequency by using faster DAC with lower bit resolution.

Preferably first order sigma-delta modulator are used as those sigma-delta modulators can be implemented without a multiplier. Thus they can be easily operated at a high clock rate and are not a speed limiting element. Of course also sigma delta modulators of higher order can be designed with a configurable number of output lines.

Figure 3:
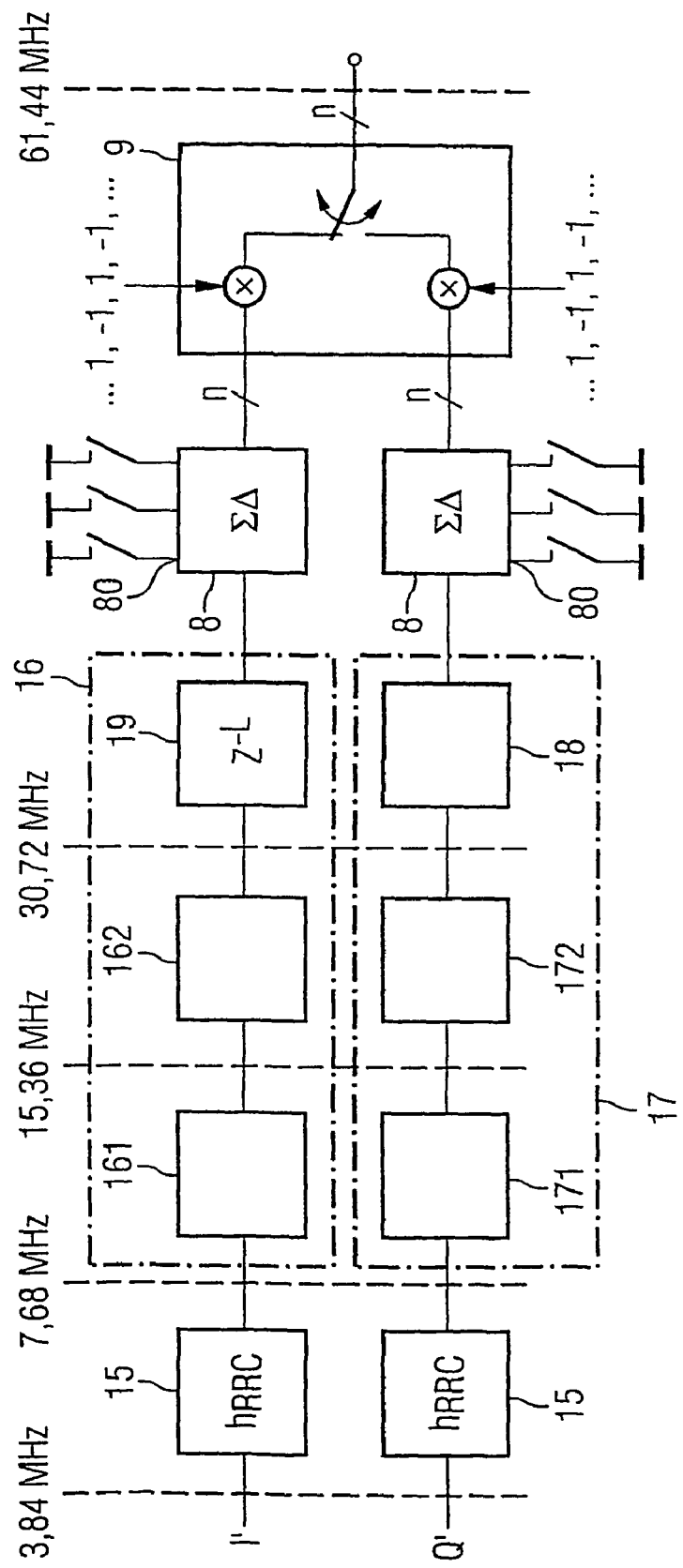

Another embodiment of the interpolation filter is shown in FIG. 3. The last interpolation filter stages 152, 153 in the in-phase and quadrature signal paths are chosen identical. The missing samples between the output samples of the last interpolation filters have to be interpolated in one of the two signal branches. For that purpose an interpolation filter with factor two can be used where all arithmetic functions are removed which compute those samples that are not used by the IQ-modulator 9. For example in a typical half-band filter, with the exception of the centre coefficient every second coefficient is zero. As a consequence these filters can be divided into two parts running at half of the output sample rate. The first part just multiplies the input samples with the centre coefficient and thus leaves the input sequence unaffected apart from another amplitude scaling. The second part computes the intermediate, i.e. interpolated samples, by a weighted sum of all other nonzero coefficients. Consequently, the first part can be removed. The remaining interpolator 18 operates at the same clock rate as the preceding interpolation filter stage 162. The latency of the remaining interpolator 18 has to be compensated by a simple delay circuit 19 in the other signal branch. This delay circuit 19 could be easily realized by an adequate number of shift registers.

The previously described embodiments apply the time shift in a most efficient way. Of course there are also other possibilities to introduce a time shift. In case of spectral shaping based on fast Fourier transform a phase shift can be achieved by multiplying the frequency domain function with $\exp(j\phi)$, where $\phi$ corresponds to a time shift $1/f_s$ and $f_s$ is the sampling rate. In case of the present W-CDMA system spectral shaping is done with an interpolation root-raised-cosine (RRC) filter realized by a high order finite impulse response (FIR) filter. A phase respective a time shift can easiest be introduced if the filter is designed from the analytical description of its impulse response h. In practice the time length is truncated. Best characteristics with time limited impulse response h are obtained by windowing with a Kaiser-Bessel window in the time domain. The filter coefficients of an interpolating RRC filter of order N with roll-off factor $\eta$ and interpolation factor r thus can be calculated by $$h_{n,\tau} = \frac{4\eta}{4\eta + \pi(1-\eta)} \cdot \frac{n' \cdot \cos[\pi(1+\eta) \cdot n'] + \sin[\pi(1-\eta) \cdot n']}{n'[1-(4\eta \cdot n')^2]} \cdot w_n$$

$$\text{with } n' = \frac{n - \tau - \frac{N}{2}}{r}$$

where $\tau$ is the time shift, $w_n$ is the window function and $h_n$ is normalized such that $h(0)=1$. If the sample rate after the RRC filter is $f_s/m$, $\tau$ has to be $1/m$ in one of the in-band or quadrature branches and zero in the other to compensate the time shift in the base band modulator. $\tau$ can be chosen positive or negative depending on the mutual phases of the modulation sequences.

Another option is to have different $\tau$ for the in-phase and quadrature signal path, e.g. $\tau(I)=\frac{1}{2}$ m and $\tau(Q)=-\frac{1}{2}$ m or vice versa or any other values yielding an appropriate delay difference between the in-phase and quadrature signal path. The drawback of a nonzero timeshift filter is that the filter coefficients become unsymmetrical around t=0 what means a higher resources than an implementation as a symmetrical filter.

Usually the interpolation filtering with factor m after the spectral shaping is not done in one single step but distributed over a cascade of interpolation filters with as low as possible interpolation factors, i.e. in steps of the prime factors of m where the lower factors are at the beginning and the higher factors at the end of the cascade. This is considered to be the most efficient way of implementation since it yields the lowest numbers of filter taps and thus arithmetic operations.

Another possibility is to introduce the time shift within the interpolation filter stages. The time shift can be introduced anywhere in the filter cascade, however, the design of the concerning filter must be based on an analytical description of the impulse response as in the case of the RRC filter. A good solution seems to be a raised-cosine characteristic for which the filter coefficients may be calculated by $$h_{n,\tau} = \frac{\sin(\pi \cdot n') \cdot \cos(\pi \eta \cdot n')}{\pi \cdot n' \cdot [1 - (2\eta \cdot n')^2]} \cdot w_n$$

The difference of $\tau$ between the corresponding filters in the in-phase and quadrature branch is $1/m'$, where $m'$ is the remaining interpolation factor after this filter stage.

Furthermore it has be mentioned again that the invention is not restricted to the specific embodiments and examples described in the present invention. That is, on the basis of the teaching contained in the description, various modifications and variations of the invention may be carried out. For example the usage of an intermediate frequency signal should not be taken as a restriction of the invention to up-conversion transmitters. Provided digital components with a processing speed that matches to the desired radio frequency are applied also a direct generation of the radio frequency, without the need of generating an intermediate frequency signal is feasible and lays therefore within the scope of the invention. Also the invention is not restricted to devices for cellular phones, also communication systems without central stations like point-to-point radio link systems or push-to-talk phones, like CB radio may take advantage of the claimed modulation method.

The invention claimed is:

1. A communication device with a circuit arrangement for generating an analogue signal from a digital input signal in form of a complex baseband signal, represented by samples of an in-phase and a quadrature-phase component (I', Q') comprising
    a first interpolation filter (16) for generating up-sampled in-phase samples from said in-phase input samples, each sample having a first bit width (m);
    a first sigma-delta modulator (8) to which the up-sampled in-phase samples are input to, generating sigma-delta modulated in-phase output samples of a second bit width (n), whereby the bit width of the sigma-delta modulated samples is lower than the bit width of the up-sampled in-phase samples;
    a second interpolation filter (17) for generating up-sampled quadrature-phase samples from the said in-phase input samples, each sample having said first bit width (m);
    a second sigma-delta modulator (8) to which the up-sampled quadrature-phase samples are input to, generating sigma-delta modulated quadrature-phase output samples of a second bit width (n), whereby the bit width of the sigma-delta modulated quadrature-phase output samples is lower than the bit width of the up-sampled quadrature-phase samples;
    an IQ-modulator for generating from said sigma-delta modulated in-phase and quadrature-phase samples a stream of IQ-modulated samples;
    a digital-to-analogue converter (10) for generating said analogue signal from that stream of IQ-modulated samples; and,
    wherein said first and second sigma-delta modulators each include a control circuit arrangement (82, 84) for controlling the bit width (n) of the output samples of said sigma-delta modulator (8).

2. The communication device according to claim 1, wherein at least one of the first and second sigma-delta modulators (8) further comprises at least one adder (81) having a plurality of output lines and at least one quantization error filter (83) and wherein said control circuit arrangement (82, 84) comprises at least one switch (821, 822) which is inserted in at least one of the output lines of said adder (81) for switching said output line of the adder (81) to the output of said at least one sigma-delta modulator or to said quantization error filter (83).

3. The communication device according to claim 1, wherein a mutual time shift between the in-phase input samples and the quadrature-phase samples is achieved by providing for one of the in-phase or quadrature-phase component signals an interpolation filter (162) with even order and for the other in-phase or quadrature-phase component signal an interpolation filter (172) with odd order.

4. The communication device according to claim 1, wherein a mutual time shift between the in-phase input samples and the quadrature-phase samples is achieved by applying an interpolation to either the in-phase samples or to the quadrature-phase samples, whereby in that interpolation filter all arithmetic functions are removed which compute samples that are not used by the IQ-modulator.

5. The communication device according to claim 1, wherein a mutual time shift between the in-phase input samples and the quadrature-phase samples is achieved by implementing a spectral shaping filter using a fast Fourier transform and multiplying a frequency domain function with $\exp(j\phi)$, where $\phi$ corresponds to a time shift $1/f_s$ and $f_s$ is the sampling rate.

* * * * *